US010777506B2

(12) United States Patent
Hille et al.

(10) Patent No.: US 10,777,506 B2
(45) Date of Patent: Sep. 15, 2020

(54) SILICON CARBIDE SEMICONDUCTOR DEVICE HAVING A METAL ADHESION AND BARRIER STRUCTURE AND A METHOD OF FORMING SUCH A SEMICONDUCTOR DEVICE

(71) Applicant: Infineon Technologies AG, Neubiberg (DE)

(72) Inventors: Frank Hille, Munich (DE); Ravi Keshav Joshi, Villach (AT); Michael Fugger, Landskron (AT); Oliver Humbel, Maria Elend (AT); Thomas Laska, Munich (DE); Matthias Müller, Regensburg (DE); Roman Roth, Sattendorf (AT); Carsten Schaeffer, Annenheim (AT); Hans-Joachim Schulze, Taufkirchen (DE); Holger Schulze, Villach (AT); Juergen Steinbrenner, Noetsch (AT); Frank Umbach, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/577,316

(22) Filed: Sep. 20, 2019

(65) Prior Publication Data

US 2020/0013722 A1 Jan. 9, 2020

Related U.S. Application Data

(63) Continuation of application No. 15/458,366, filed on Mar. 14, 2017, now Pat. No. 10,475,743.

(30) Foreign Application Priority Data

Mar. 15, 2016 (DE) .......................... 10 2016 104 788

(51) Int. Cl.
*H01L 23/532* (2006.01)
*H01L 23/485* (2006.01)
(Continued)

(52) U.S. Cl.
CPC .. *H01L 23/53209* (2013.01); *H01L 21/76846* (2013.01); *H01L 21/76861* (2013.01);
(Continued)

(58) Field of Classification Search
CPC ............ H01L 23/53209; H01L 23/485; H01L 21/76898; H01L 21/76861; H01L 23/5226; H01L 23/528; H01L 21/76846
See application file for complete search history.

(56) References Cited

U.S. PATENT DOCUMENTS 4,880,708 A * 11/1989 Sharma ............. H01L 23/53242
428/620
5,173,449 A * 12/1992 Lorenzen .......... H01L 21/28568
148/DIG. 20
(Continued)

FOREIGN PATENT DOCUMENTS

CN 1227402 A 9/1999
CN 102832199 A 12/2012
(Continued)

OTHER PUBLICATIONS

Hoffman, Vance, "Tungsten Titanium Diffusion Barrier Metallization", Solid State Technology, Jun. 1983, pp. 119-126.
(Continued)

*Primary Examiner* — Kyoung Lee
(74) *Attorney, Agent, or Firm* — Murphy, Bilak & Homiller, PLLC (57) ABSTRACT

According to an embodiment of a semiconductor device, the semiconductor devices includes a metal structure electrically connected to a silicon carbide semiconductor body and
(Continued)

a metal adhesion and barrier structure between the metal structure and the silicon carbide semiconductor body. The metal adhesion and barrier structure includes a layer comprising titanium and tungsten.

13 Claims, 4 Drawing Sheets

(51) Int. Cl.
    *H01L 21/768*     (2006.01)
    *H01L 23/522*     (2006.01)
    *H01L 23/528*     (2006.01)

(52) U.S. Cl.
    CPC ...... *H01L 21/76898* (2013.01); *H01L 23/485* (2013.01); *H01L 23/528* (2013.01); *H01L 23/5226* (2013.01); *H01L 23/53238* (2013.01)

(56) References Cited

U.S. PATENT DOCUMENTS

| | | | |
|---|---|---|---|
| 6,316,831 B1 * | 11/2001 | Wang | H01L 23/49816 257/737 |
| 9,196,560 B2 | 11/2015 | Roth et al. | |
| 2004/0209406 A1 * | 10/2004 | Jan | H01L 24/11 438/148 |

FOREIGN PATENT DOCUMENTS

| | | |
|---|---|---|
| DE | 102006049354 B3 | 6/2008 |
| DE | 102014114517 A1 | 4/2015 |
| DE | 102014115177 A1 | 4/2015 |
| EP | 0279588 A2 | 8/1988 |
| JP | H03132022 A | 6/1991 |
| JP | H03129728 U | 12/1991 |
| JP | H05243178 A | 9/1993 |
| JP | H0629295 A | 2/1994 |
| JP | H09298238 A | 11/1997 |
| JP | H10144790 A | 5/1998 |
| JP | H11135501 A | 5/1999 |
| JP | 2001015549 A | 1/2001 |
| JP | 2002334882 A | 11/2002 |
| JP | 2003273350 | 9/2003 |
| JP | 2014110362 A | 6/2014 |
| JP | 2014146762 A | 8/2014 |
| JP | 2014175471 A | 9/2014 |

OTHER PUBLICATIONS

Nowicki, R.S., et al., "Studies of the Ti-W/Au Metallization on Aluminum", Thin Solid Films, vol. 53, Issue 2, 1978, pp. 195-205.

* cited by examiner

SILICON CARBIDE SEMICONDUCTOR DEVICE HAVING A METAL ADHESION AND BARRIER STRUCTURE AND A METHOD OF FORMING SUCH A SEMICONDUCTOR DEVICE

BACKGROUND

Metallization is a key element in semiconductor technology. Metallization is in charge of current transport in and out of a semiconductor chip as well as removal of heat generated during operation of the semiconductor chip. Metal adhesion and barrier structures aim at providing adhesion between metallization and a support structure such as a semiconductor body and preventing metal atoms from diffusing from the metal structure into a semiconductor substrate. It is desirable to improve reliability of barrier and adhesion characteristics over a desired time span, to reduce damage of barrier characteristics due to defects and particles as well as to improve ability to screen barrier defects.

SUMMARY

The present disclosure relates to a semiconductor device. The semiconductor device comprises a metal structure electrically connected to a semiconductor body. The semiconductor device further comprises a metal adhesion and barrier structure between the metal structure and the semiconductor body. The metal adhesion and barrier structure comprises a first layer comprising titanium and tungsten, and a second layer comprising titanium, tungsten, and nitrogen on the first layer comprising titanium and tungsten.

The present disclosure further relates to a semiconductor device comprising a metal structure electrically connected to a semiconductor body. The semiconductor device further comprises a metal adhesion and barrier structure between the metal structure and the semiconductor body, wherein the metal adhesion and barrier structure comprises a layer comprising aluminum, and Ti/TiN on the layer comprising aluminum.

The present disclosure also relates to a method of manufacturing a semiconductor device. The method comprises forming a metal adhesion and barrier structure on a semiconductor body. The method further comprises forming a metal structure on the metal adhesion barrier structure. Formation of the metal adhesion and barrier layer comprises forming a first layer comprising titanium and tungsten, and forming a second layer comprising titanium, tungsten, and nitrogen on the first layer comprising titanium and tungsten.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. As a typical base material for manufacturing a variety of such semiconductor devices, silicon wafers grown by the Czochralski (CZ) method, e.g. by the standard CZ method or by the magnetic CZ (MCZ) method or by the Continuous CZ (CCZ) method may be used. Also FZ (Float-Zone) silicon wafers may be used. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a semiconductor die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside or rear surface while the first surface is considered to be formed by the upper, front or main surface of the semiconductor substrate. The terms "above" and "below" as used in this specification therefore describe a relative location of a structural feature to another.

In this specification, embodiments are illustrated including p- and n-doped semiconductor regions. Alternatively, the semiconductor devices can be formed with opposite doping relations so that the illustrated p-doped regions are n-doped and the illustrated n-doped regions are p-doped.

The semiconductor device may have terminal contacts such as contact pads (or electrodes) which allow electrical contact to be made with the integrated circuit or discrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, Al, Ti and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD) evaporation, hybrid physical-chemical vapor deposition (HPCVD), etc.

The applied conductive layer may comprise, inter alia, one or more of a layer of metal such as Al, Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

Figure 1:
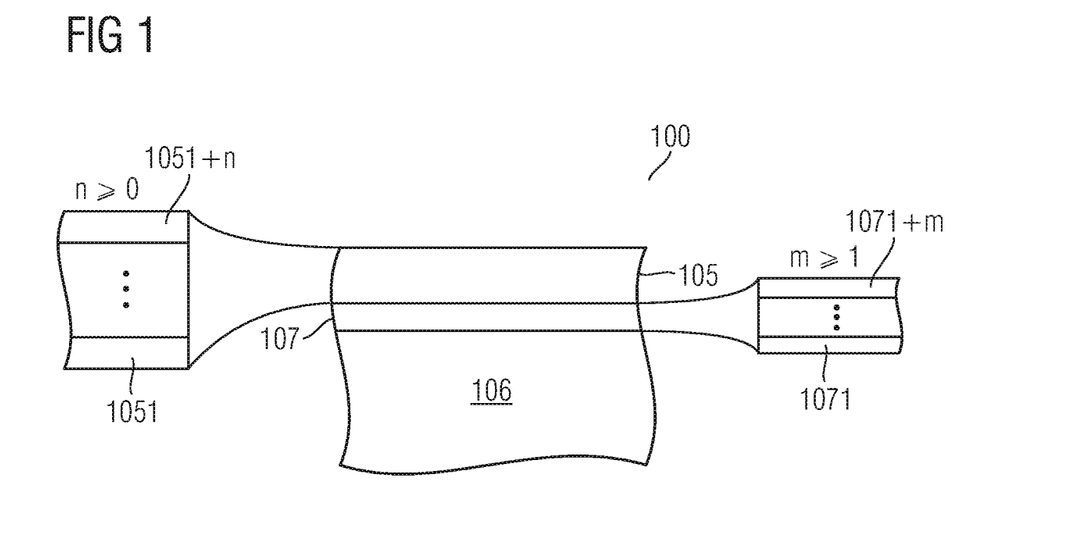
FIG. 1 is a schematic cross-sectional view of an embodiment of a portion of a semiconductor device comprising a metal structure electrically connected to a semiconductor body, and a metal adhesion and barrier structure between the metal structure and the semiconductor body.

In the schematic cross-sectional view of a portion of a semiconductor device 100 depicted in FIG. 1, the semiconductor device 100 comprises a metal structure 105 electrically connected to a semiconductor body 106. A metal adhesion and barrier structure 107 is between the metal structure 105 and the semiconductor body 106.

The metal structure includes one or more sub-layers $1051, \ldots, 1051+n$, wherein n is equal to or greater than zero, i.e. $n \geq 0$. A thickness of the metal structure 105 may be in a range of 3 μm to 100 μm or between 5 μm and 50 μm. For n=0, the metal structure 105 consists of a single metal layer, for example a copper layer. For n>0, for example n=1, 2, 3, or more, the metal structure includes a plurality of metal layers, i.e. consists of a metal layer stack.

The metal adhesion and barrier structure 107 includes two or more sub-layers $1071, \ldots, 1071+m$, wherein m is equal to or greater than one, i.e. $m \geq 1$. For m=1, the metal adhesion and barrier structure 107 is a dual metal adhesion and barrier layer stack. In some embodiments, the metal adhesion and barrier structure 107 comprises a layer comprising titanium and tungsten, for example implementing the layer 1071, and a layer comprising titanium, tungsten, and nitrogen on the layer comprising titanium and tungsten. The layer comprising titanium, tungsten, and nitrogen allows for a stabilization of the overall metal adhesion and barrier structure 107. The layer comprising titanium, tungsten, and nitrogen, or another barrier layer on the layer comprising titanium and tungsten provides a coverage of defects in the layer below, i.e. the layer comprising titanium and tungsten. Since it is unlikely that defects in the layer comprising titanium, tungsten, and nitrogen or in another barrier layer on the layer comprising titanium and tungsten on the one side and defects in the layer below, i.e. the layer comprising titanium and tungsten on the other side are congruent with each other, penetration of metal, for example copper from the metal structure through weak points of the upper barrier, for example the layer comprising titanium, tungsten, and nitrogen into the semiconductor body may be hindered by the lower barrier layer, for example the layer comprising titanium and tungsten.

Optional intermediate layers may be sandwiched between any neighboring sub-layers, for example sub-layer 1071 and sub-layer 1072 of the layer metal adhesion and barrier structure 107. The intermediate layer(s) aim at hindering crystallographic growth of an upper barrier on a lower barrier layer. Exemplary materials of the optional intermediate layer(s) include metals, for example tungsten (W), titanium (Ti), tantalum (Ta), copper (Cu), silver (Ag), and semiconductor materials, for example amorphous or polycrystalline silicon or carbon.

In some embodiments, the layer comprising titanium and tungsten is a TiW layer having a thickness in a range of 30 nm to 600 nm or between 50 nm and 500 nm or between 100 nm and 300 nm. In some embodiments, a thickness of the layer comprising titanium, tungsten, and nitrogen is in a range of 30 nm to 600 nm or between 50 nm and 500 nm or between 100 nm and 300 nm.

In some embodiments, the metal adhesion and barrier structure 107 further comprises a tungsten layer on the layer comprising titanium, tungsten, and nitrogen. Formation of the tungsten layer is beneficial in regard to encasing defects in a layer below. Embedding of particles may be improved by deposition of tungsten, for example by a chemical vapor deposition (CVD) technique or other layer deposition techniques. 5. In some embodiments, the metal adhesion and barrier structure 107 further comprises a layer comprising titanium and tungsten on the layer comprising titanium, tungsten, and nitrogen. In some embodiments, the metal adhesion and barrier structure 107 further comprises a tungsten layer on the layer comprising titanium, tungsten, and nitrogen, and a layer comprising titanium and tungsten on the tungsten layer.

Is some embodiments, the metal adhesion and barrier structure 107 further comprises a metal adhesion and barrier substructure between the semiconductor body 106 and the layer comprising titanium and tungsten, the metal adhesion and barrier substructure being in contact with the semiconductor body 106. The metal adhesion and barrier substructure may be implemented by sub-layers 1071, . . . , 1071+i, i≥0, whereas the layer comprising titanium and tungsten may correspond to sub-layer 1071+i+1. In some embodiments, the metal adhesion and barrier substructure is made of one or a combination of TiW, TiN, Ti/TiN, TiN/Ta. A thickness of the metal adhesion and barrier substructure may be in a range of 30 nm to 600 nm or between 50 nm and 500 nm or between 100 nm and 300 nm.

Similar to the considerations above, the sub-layer 1071+i+1 provides a coverage of defects in the layer metal adhesion and barrier structure 107 below, for example the sub-layer 1071+i. Since it is unlikely that defects in the sub-layer 1071+i+1 and defects in the layer below, i.e. the sub-layer 1071+i are congruent with each other, penetration of metal, for example copper from the metal structure 105 through weak points of the upper barrier, for example the sub-layer 1071+i+1 may be hindered by the lower barrier layer, for example the sub-layer 1071+i or any other lower layer of the metal adhesion and barrier structure 107.

Figure 2:
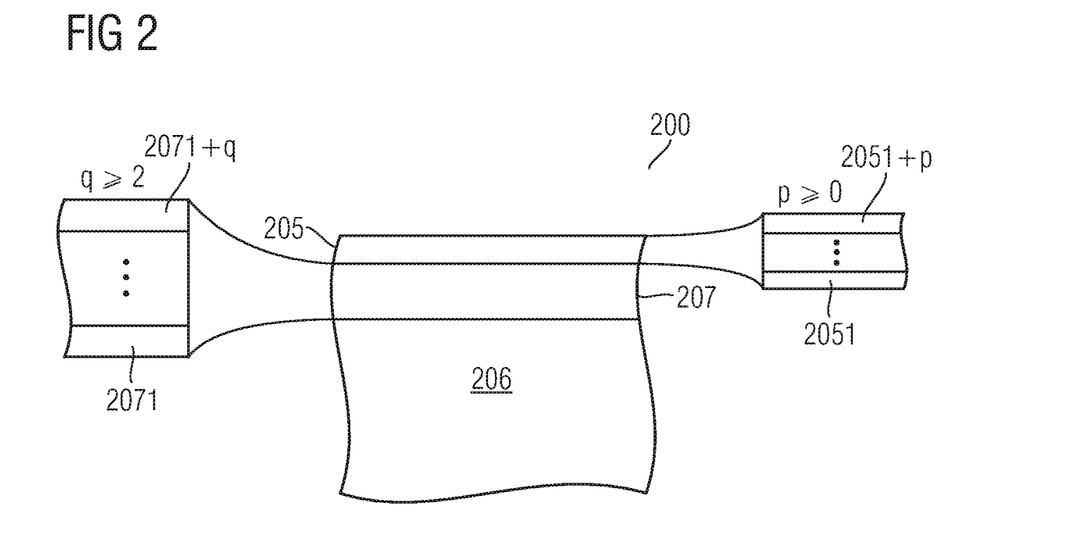
FIG. 2 is a schematic cross-sectional view of another embodiment of a portion of a semiconductor device comprising a metal structure electrically connected to a semiconductor body, and a metal adhesion and barrier structure between the metal structure and the semiconductor body.

In the schematic cross-sectional view of a portion of a semiconductor device 200 depicted in FIG. 2, the semiconductor device 200 comprises a metal structure 205 electrically connected to a semiconductor body 206. A metal adhesion and barrier structure 207 is arranged between the metal structure 205 and the semiconductor body 206.

The metal structure 205 includes one or more sub-layers 2051, . . . , 2051+p, wherein p is equal to or greater than zero, i.e. p≥0. A thickness of the metal structure 205 may be in a range of 3 μm to 100 μm or between 5 μm and 50 μm. For p=0, the metal structure 105 consists of a single metal layer, for example a copper layer. For p>0, for example p=1, 2, 3, or more, the metal structure includes a plurality of metal layers, i.e. consists of a metal layer stack.

The metal adhesion and barrier structure 207 includes three or more sub-layers 2071, . . . , 2071+q, wherein q is equal to or greater than two, i.e. q≥2. For q=2, the metal adhesion and barrier structure 201 is a triple metal adhesion and barrier layer stack. In some embodiments, the metal adhesion and barrier structure 207 comprises a layer comprising aluminum, for example implemented as the sub-layer 2071, and a Ti/TiN layer, for example implemented as sub-layers 2072, 2073 on the layer comprising aluminum.

In some embodiments, the metal adhesion and barrier structure 207 or the metal adhesion barrier substructure described with respect to FIG. 1 is made of AlSiCu/Ti/TiN, wherein AlSiCu is in contact with the semiconductor body 206.

In some other embodiments, the metal adhesion and barrier structure 207 or the metal adhesion barrier substructure described with respect to FIG. 1 is made of AlCu/Ti/TiN, wherein AlCu being is in contact with the semiconductor body 206.

In some embodiments, a thickness of TiN in the metal adhesion and barrier structure 207 or the metal adhesion barrier substructure described with respect to FIG. 2 is in a range of 5 nm and 150 nm or between 10 nm and 100 nm.

In some embodiments, a thickness of Ti in the metal adhesion and barrier structure 207 or the metal adhesion barrier substructure described with respect to FIG. 2 is in a range of 1 nm and 150 nm or in a range of 2 nm and 100 nm or in a range of 3 nm and 50 nm.

In some embodiments, the metal structure 105, 205 comprises a copper layer in direct contact with the metal adhesion and barrier structure 107, 207, a thickness of the copper layer being greater than 4 μm or greater than 9 μm or even greater than 19 μm. In some embodiments, at least one or more metal layers are formed on the copper layer.

In some embodiments, the atomic percent, at % of nitrogen in the layer comprising titanium, tungsten, and nitrogen is in a range of 1% to 50%.

The layer comprising aluminum allows for improving the contact properties to low-doped semiconductor regions of the semiconductor body, for example to low p-doped regions. Spiking in silicon semiconductor bodies may be suppressed or at least reduced by adding silicon to the layer comprising aluminum. In addition, a TiN layer on or below the layer comprising aluminum may act as a barrier against diffusion of silicon out of the layer comprising aluminum and thus, spiking may be suppressed. The aluminum in the layer comprising aluminum may, based on an appropriate thermal budget, locally dope any low doped semiconductor body at an interface to the layer comprising aluminum for providing an appropriate ohmic contact. Instead of AlSiCu as an example for the layer comprising aluminum, also AlCu or Al may be used provided that a thickness is kept at a lower minimum, for example lower than 100 nm, or lower than 50 nm, or lower than 30 nm, or lower than 10 nm or even lower than 5 nm for securing local dissolution of silicon into the AlCu allowing for an appropriate ohmic contact. If the thickness is kept to the lower minimum, spikes may not be detrimental for device performance, for example.

Figure 3:
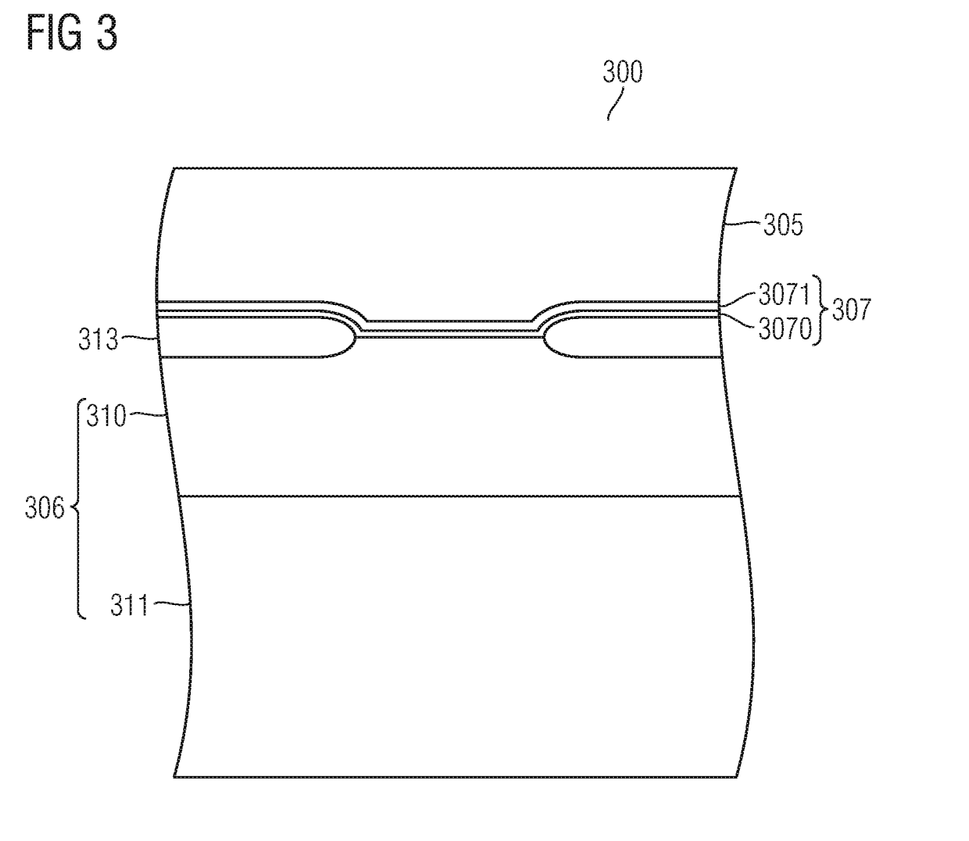
FIG. 3 is a schematic cross-sectional view of another embodiment of a portion of a semiconductor device comprising a metal structure electrically connected to a low p-doped semiconductor region of a semiconductor body.

In the schematic cross-sectional view of a portion of a semiconductor device 300 depicted in FIG. 3, an embodiment of a metal adhesion and barrier structure 305 on a low p-doped semiconductor region 310 is illustrated for the purpose of achieving a reliable contact on a low p-doped silicon region, for example an emitter region. Specific examples of the semiconductor device 300 include diodes, for example free-wheeling diodes and transistors, for example insulated gate field effect transistors (or IGFETs) and (reverse conducting) insulated gate bipolar transistors (RC-IGBTs or IGBTs). The low p-doped semiconductor region 310 may be formed in or on an n-doped semiconductor substrate 311, for example. The low p-doped semiconductor region 310 may include a doping concentration in a range of $10^{17}$ to $10^{18}$ cm$^{-3}$, for example adjusted by boron ion implantation at a dose in a range of $2 \times 10^{12}$ cm$^{-2}$ to $5 \times 10^{14}$ cm$^{-2}$, for example $6 \times 10^{12}$ cm$^{-2}$ and annealing temperatures in a range of 900° C. to 1250° C., for example 1150° C. for a duration of 100 minutes to 2000 minutes, for example 200 minutes. A part of the metal adhesion and barrier structure 307 is in contact with the low p-doped semiconductor region 310 and an insulating layer 313, for example a field dielectric such as a field oxide structure or a local oxidation of silicon (LOCOS) structure is sandwiched between the low p-doped semiconductor region 310 and another part of the metal adhesion and barrier structure 307.

Ohmic contact to the low p-doped semiconductor region 310 is provided via a first metal barrier and adhesion substructure 3070 that may be implemented as described with respect to FIG. 2 and include a layer comprising aluminum, for example AlSiCu or AlCu in contact with the low p-doped semiconductor region 310. Reliability improvement of the metal adhesion and barrier structure 307 may be further improved by implementing a second metal barrier and adhesion substructure 3071 as described with reference to FIG. 1, for example by a layer comprising titanium and tungsten, and a layer comprising titanium, tungsten, and nitrogen on the layer comprising titanium and tungsten.

A metal structure 305 is formed on the metal adhesion and barrier structure 307 and electrically connected to the low p-doped semiconductor region 310 via the metal adhesion and barrier structure 307. The metal structure 305 may be implemented as described with reference to the metal structures 105, 205 illustrated in FIGS. 1, 2, for example.

In some embodiments, the semiconductor device 100, 200, 300 is a power semiconductor device for switching or rectifying load currents greater 10 mA, for example greater 100 mA, or 1 A, or 10 A, or 100 A. The semiconductor device 100, 200, 300 may be a power semiconductor diode and/or may include transistor cells. For example, the semiconductor device 100, 200, 300 may be or may include an IGFET (insulated gate field effect transistor), for example a MOSFET (metal oxide semiconductor FET) in the usual meaning including FETs with metal gates as well as FETs with non-metal gates, a trench field plate FET, a superjunction FET or a smart FET integrating transistor cells of a power MOSFET and low voltage transistor cells of, e.g., logic and/or driver circuits in CMOS (complementary metal-oxide-semiconductor) technology, an IGBT (insulated gate bipolar transistor), or an MCD (MOS controlled diode).

Figure 4:
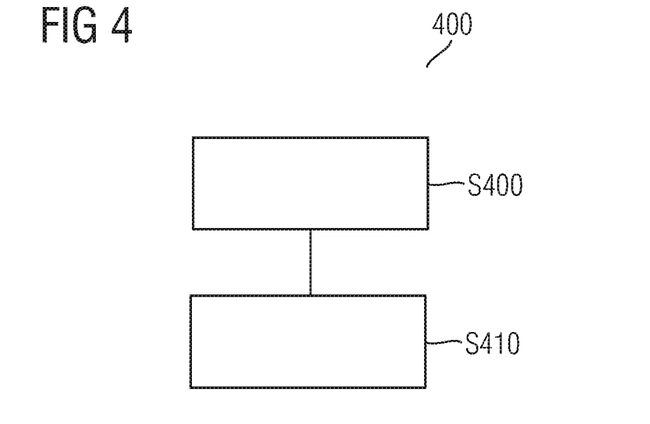
FIG. 4 is a schematic flow diagram for illustrating a method of manufacturing a semiconductor device.

FIG. 4 is a schematic flow diagram for illustrating a method 400 of manufacturing a semiconductor device.

It will be appreciated that while method 400 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Process feature S400 comprises forming a metal adhesion and barrier structure on a semiconductor body.

Process feature S410 comprises forming a metal structure on the metal adhesion and barrier structure, wherein formation of the metal adhesion and barrier layer comprises forming a layer comprising titanium and tungsten, and forming a layer comprising titanium, tungsten, and nitrogen on the layer comprising titanium and tungsten.

Technical explanations, for example details or examples of materials or technical benefits described above with reference to FIG. 1 likewise apply.

In some embodiments, formation of the layer comprising titanium, tungsten, and nitrogen comprises forming a layer comprising titanium and tungsten, and nitriding the layer comprising titanium and tungsten. During nitriding, a heat treating or thermal process is carried out that diffuses nitrogen into the surface of a metal to create a case-hardened surface. By way of example, nitriding may be carried out by of gas nitriding. In gas nitriding, a nitrogen rich gas, for example ammonia (NH3) is brought into contact with the heated metal adhesion and barrier structure and dissociates into nitrogen and hydrogen. The nitrogen then diffuses onto the surface of the metal adhesion and barrier structure creating a nitride layer. By way of another example, nitriding may be carried by way of plasma nitriding, also known as ion nitriding, plasma ion nitriding or glow-discharge nitriding. In plasma nitriding, the reactivity of the nitriding media is not due to the temperature but to the gas ionized state. In this technique intense electric fields are used to generate ionized molecules of the gas around the surface to be nitrided. A further example of nitriding is reactive sputtering of TiWN. In this case a physical vapor deposition (PVD) process from a TiW target is carried out in a reactive gas that may include, for example $N_2$ and Ar or Kr or Xe. $N_2$ in the sputter atmosphere typically ranges between 1% to 50%.

In some embodiments, surface cleaning processes are carried out prior to formation of one or both of the layer comprising titanium and tungsten and the layer comprising titanium, tungsten, and nitrogen. Surface cleaning processes may include processes of removing contaminants, for example particles as well as metallic and organic from the surface of the semiconductor body and can be implemented using liquid chemicals (wet cleaning) of gases (dry cleaning). During dry cleaning, contaminants are removed from the surface of the semiconductor body in the gas-phase. This may be caused by conversion of contaminants into volatile compound through chemical reaction, removal from the surface via momentum transfer, or lift-off during slight etching of the contaminated surface. During wet cleaning, contaminants are removed from the wafer surface in the liquid-phase. Wet cleaning chemistries are selected to form soluble compounds of surface contaminants, often enhanced by megasonic agitation. Typically, deionized water rinse and dry cycle follow application of the cleaning chemistries.

In some embodiments, one or both of the layer comprising titanium and tungsten and the layer comprising titanium, tungsten, and nitrogen is formed by chemical vapor deposition. In a further embodiment, a further tungsten layer is arranged between the layer comprising titanium and tungsten and the layer comprising titanium, tungsten, and nitrogen. Chemical vapor deposition allows for a form-locked encapsulation of contaminants of smaller particles. In case of presence of larger particles, decomposition of tungsten hexafluoride used for depositing tungsten metal in a chemical vapor deposition process into W and HF in a hydrogen containing ambient allows, caused by the HF, for an enlargement of defects into the semiconductor body. Subsequent processes such as metal layer deposition, for example copper deposition result in a pronounced copper silicide grain that can be detected as a failure in an acceptance inspection. Thus, larger particles may be rejected by electrical inspection methods. Chemical vapor deposition based on aggressive chemistries such as decomposition of tungsten hexafluoride into HF allow for an improvement of a reliability of barrier and adhesion characteristics.

In some embodiments, an uppermost part of the metal adhesion and barrier structure, for example sub-layer 1071+m illustrated in FIG. 1 or sub-layer 2071+q illustrated in FIG. 2 and a lowermost part of the metal structure, for example sub-layer 1051 illustrated in FIG. 1 or sub-layer 2051 illustrated in FIG. 2 are formed in a same processing chamber without interruption of vacuum conditions. Formation of these layers in the same processing chamber allows for a suppression of exposure of the uppermost part of the metal adhesion and barrier structure to an oxygen containing ambient which may otherwise result in an undesired loss of adhesive strength between the uppermost part of the metal adhesion and barrier structure and the lowermost part of the metal structure.

In some embodiments, the metal structure includes a copper layer. The copper layer may be formed on a thin copper seed layer. The thin copper seed layer and an adhesion layer may be formed in-situ, for example. The copper layer as well as the thin copper seed layer may be formed in a same processing chamber, for example in a sputter system, for example a magnetron sputter system. The copper layer may also be formed in a different processing equipment, for example in a copper plating process equipment for providing copper layers having a large thickness, for example a thickness greater than 5 µm, or greater than 10 µm, or even greater than 15 µm.

Figure 5:
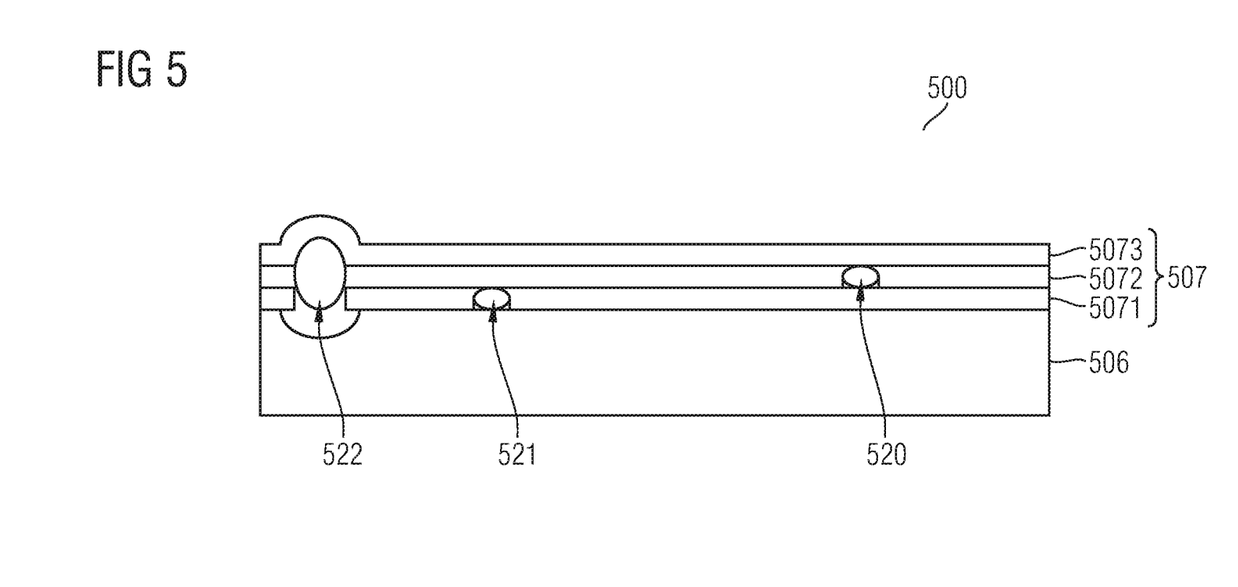
FIG. 5 is a schematic cross-sectional view of a metal adhesion and barrier structure on a semiconductor body for illustrating reliability improvements based on defect screening.

In the schematic cross-sectional view of a portion of a semiconductor device 500 depicted in FIG. 5, different defect scenarios in a metal adhesion and barrier structure 507 are illustrated. The metal adhesion and barrier structure 507 is exemplified as a three layer stack of first to third sub-layers 5071, 5072, 5073. However, another number of stack layers, for example two, four, five, six or even more layers may be used. The details described with respect to the metal adhesion and barrier structures 107, 207 of FIGS. 1, 2 apply likewise.

A first detect 520, for example a contaminant and/or particle on a level of the second sub-layer 5072 is covered by the third sub-layer 5073 that may be formed by a CVD process, for example. A second defect 521, for example a contaminant and/or particle on a level of the first sub-layer 5071 is covered by the second sub-layer 5072 that may also be formed by a CVD process, for example. A larger third defect 522, for example a wormhold may extend through several of the first to third sub-layers 5071, 5072, 5073 and into a semiconductor body 506. Growth of the larger third defect 522 may even be promoted by aggressive chemistries during formation of the metal adhesion and barrier structure 507, for example by using tungsten hexafluoride in tungsten CVD deposition for provoking a failure during acceptance inspection. Thus, both measures allow for an improvement of the reliability of barrier and adhesion characteristics. In some embodiments, the third sub-layer 5073 comprises or consists of a TiW layer. In some embodiments, the second sub-layer 5072 comprises or consists of a tungsten layer, for example a tungsten layer formed by CVD. In some embodiments, the first sub-layer 5071 comprises or consists of a TiW/TiWN stack.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a metal structure electrically connected to a silicon carbide semiconductor body; and
   a metal adhesion and barrier structure between the metal structure and the silicon carbide semiconductor body,
   wherein the metal adhesion and barrier structure comprises a layer comprising titanium and tungsten,
   wherein the metal adhesion and barrier structure comprises a Ti/TiN layer stack.

2. The semiconductor device of claim 1, wherein the layer comprising titanium and tungsten is a TiW layer.

3. The semiconductor device of claim 1, wherein the layer comprising titanium and tungsten is a TiWN layer.

4. The semiconductor device of claim 3, wherein the atomic percent, at. %, of nitrogen in the TiWN layer is in a range of 1% to 50%.

5. The semiconductor device of claim 1, wherein the metal adhesion and barrier structure comprises a layer comprising aluminum between the layer comprising titanium and tungsten and the silicon carbide semiconductor body.

6. The semiconductor device of claim 5, wherein the layer comprising aluminum is in ohmic contact with the silicon carbide semiconductor body.

7. The semiconductor device of claim 1, wherein a thickness of the metal adhesion and barrier substructure is in a range of 30 nm to 600 nm.

8. The semiconductor device of claim 1, wherein the metal adhesion and barrier structure comprises a TiW layer and a TiWN layer, and wherein the TiW layer is arranged between the TiWN layer and the silicon carbide semiconductor body.

9. The semiconductor device of claim 1, wherein a layer comprising titanium is arranged between the layer comprising titanium and tungsten and the silicon carbide semiconductor body.

10. The semiconductor device of claim 1, wherein the metal structure comprises a copper layer in direct contact with the metal adhesion and barrier structure, and wherein a thickness of the copper layer is greater than 4 µm.

11. The semiconductor device of claim 10, wherein a layer comprising tungsten is arranged between the layer comprising titanium and tungsten and the copper layer.

12. A semiconductor device, comprising:
    a metal structure electrically connected to a silicon carbide semiconductor body; and
    a metal adhesion and barrier structure between the metal structure and the silicon carbide semiconductor body,
    wherein the metal adhesion and barrier structure comprises a layer comprising titanium and tungsten,
    wherein the layer comprising titanium and tungsten is a TiWN layer,
    wherein the atomic percent, at. %, of nitrogen in the TiWN layer is in a range of 1% to 50%.

13. A semiconductor device, comprising:
    a metal structure electrically connected to a silicon carbide semiconductor body; and
    a metal adhesion and barrier structure between the metal structure and the silicon carbide semiconductor body,
    wherein the metal adhesion and barrier structure comprises a layer comprising titanium and tungsten,
    wherein the metal structure comprises a copper layer in direct contact with the metal adhesion and barrier structure, and wherein a thickness of the copper layer is greater than 4 μm,
wherein a layer comprising tungsten is arranged between the layer comprising titanium and tungsten and the copper layer.

* * * * *